United States Patent [19]

Miller

[11] 3,952,245

[45] Apr. 20, 1976

[54] CALIBRATED QUADRAXIAL SYSTEM FOR MEASURING SHIELDING TRANSFER IMPEDANCE

[75] Inventor: John S. Miller, Torrance, Calif.

[73] Assignee: The United States of America as represented by the Secretary of the Air Force, Washington, D.C.

[22] Filed: Feb. 6, 1975

[21] Appl. No.: 547,662

[52] U.S. Cl. .............................................. 324/57 R
[51] Int. Cl.² ........................................... G01R 27/00
[58] Field of Search ......................... 324/57 R, 58 R

[56] References Cited
UNITED STATES PATENTS

| | | | |
|---|---|---|---|
| 3,145,338 | 8/1964 | Downs | 324/57 R X |
| 3,493,853 | 2/1970 | Bellamy et al. | 324/57 R |

Primary Examiner—Stanley T. Krawczewicz
Attorney, Agent, or Firm—Julian L. Siegel; Joseph E. Rusz

[57] ABSTRACT

A quadraxial system for measuring current transfer impedance in which a guard cylinder made of wire mesh surrounds a driver cylinder also of wire mesh and is resistively coupled to the guard cylinder. Within the driver cylinder is a sample cylinder resistively coupled to the driver cylinder and containing a calibration sample and a center conductor which is embedded within the sample cylinder. Electrical generating means is attached to the unloaded end of the driver cylinder inside a shielded room and a receiver is placed outside of the shielded room to obtain leakage readings. The current reaches the sample cylinder through the driver cylinder and the resistors coupling the driver cylinder to the sample cylinder.

5 Claims, 4 Drawing Figures

CALIBRATED QUADRAXIAL SYSTEM FOR MEASURING SHIELDING TRANSFER IMPEDANCE

BACKGROUND OF THE INVENTION

The resistance of a very thin conductor is constant across a particular frequency band and can be measured to be within 10 percent of the direct current resistance. The level of resistance changes in a sample with its dimensions in the well known direct current linear manner. Accepted theory indicates that the high frequency impedance Z should be 40 percent higher than the direct resistance $R$, i.e. $Z \sim \sqrt{\pi f \mu \rho + \pi f \mu \rho}$, $\sqrt{R} \sim \pi f \mu \rho \therefore Z \sim 1.4 \, R$. However, theory supports that for very thin conductors, the resistance does not change with frequency (i.e., $R_{metal}$ is not proportional to $\sqrt{\mu f}$). It can then be concluded that $Z_{metal} = R_{metal}$ = a constant up to the calculated frequency limit at which point the metal ceases to be classifiable as "very thin". Consequently, a calibration device is presented here which has a constant value of resistance (identical to impedance) from direct current up to a calculated frequency at which point the device ceases to be a calibration device due to an expected increase in its impedance. The device's usefulness as a constant impedance for calibration purposes is novel and applicable to the new test methods resulting from recent atomic weapon effects criteria in military uses.

SUMMARY OF THE INVENTION

The quadraxial fixture, described herein, consists of three concentric cylinders and an inner conductor. Two outer cylinders, the ground (or guard) and driver cylinders, are made of hardware cloth. The sample fixture and inner conductor form a coaxial system to facilitate transfer impedance tests. The guard (or ground) and driver cylinders from one line and the sample fixture from the second. The hardware metallic cloth cylinders, sample fixture, and center conductor are a constant distance to one another to yield a uniform impedance along all transmission lines. Both lines are then terminated in their characteristic impedance which can be derived from coaxial line formula. Because of the uniform impedances, the applied RF field on the fixture is distributed nearly uniformly, and furthermore, the magnituce of the field is independent of frequency. Test data obtained from individual shielding devices usually correlates (within a few db) to $R$, $2\pi fL$, $2\pi fC$, $R \sqrt{\pi f \mu}$ or $Re - \sqrt{\pi f \mu \sigma}$ which are simplified mathematical descriptions of shielding device transfer impedance. This uniform plot of test data simplifies analysis. Any nonuniform data arising from nonuniformities in the test sample or anomalies in the test equipment can be verified or corrected by retest prior to the release of the final test data. The conducted current shielding effectiveness of the test sample is defined as function of an ideally uniform outer shell current and the inner conductor induced current.

$$SE(db) = 20 \log (I_{sample \, fixture}/I_{inner \, conductor}).$$

It is therefore an object of the invention to provide a method and system for testing conducted current shielding effectiveness as well as transfer impedance ($Z = V/I$).

It is another object to provide a shielding effectiveness testing system that uses a calibration test sample whose shape is not critical to the calculation of the limiting frequency.

It is still another object to provide a thin wall testing device that has constant impedance up to a given frequency range.

It is yet another object to provide a device with an accurately measurable flat response transfer impedance and utilizing the device for calibration.

These and other features, advantages and objects of the invention will become more apparent from the following description taken in connection with the illustrative embodiment in the accompanying drawings, wherein like reference numerals refer to like elements in the several drawings and wherein:

DETAILED DESCRIPTION OF THE PREFERRED EMBODIMENT

The present invention is a method and system of exposing a sample to a measured amount of current and measuring the quantity of leakage by using a quadraxial testing fixture. This fixture includes four concentric cylinders or coaxial transmission lines that are arranged to impart current to the sample with high cylindrical symmetry and to enable repeatable measurements of the shielding effectiveness of the sample.

Figure 1:
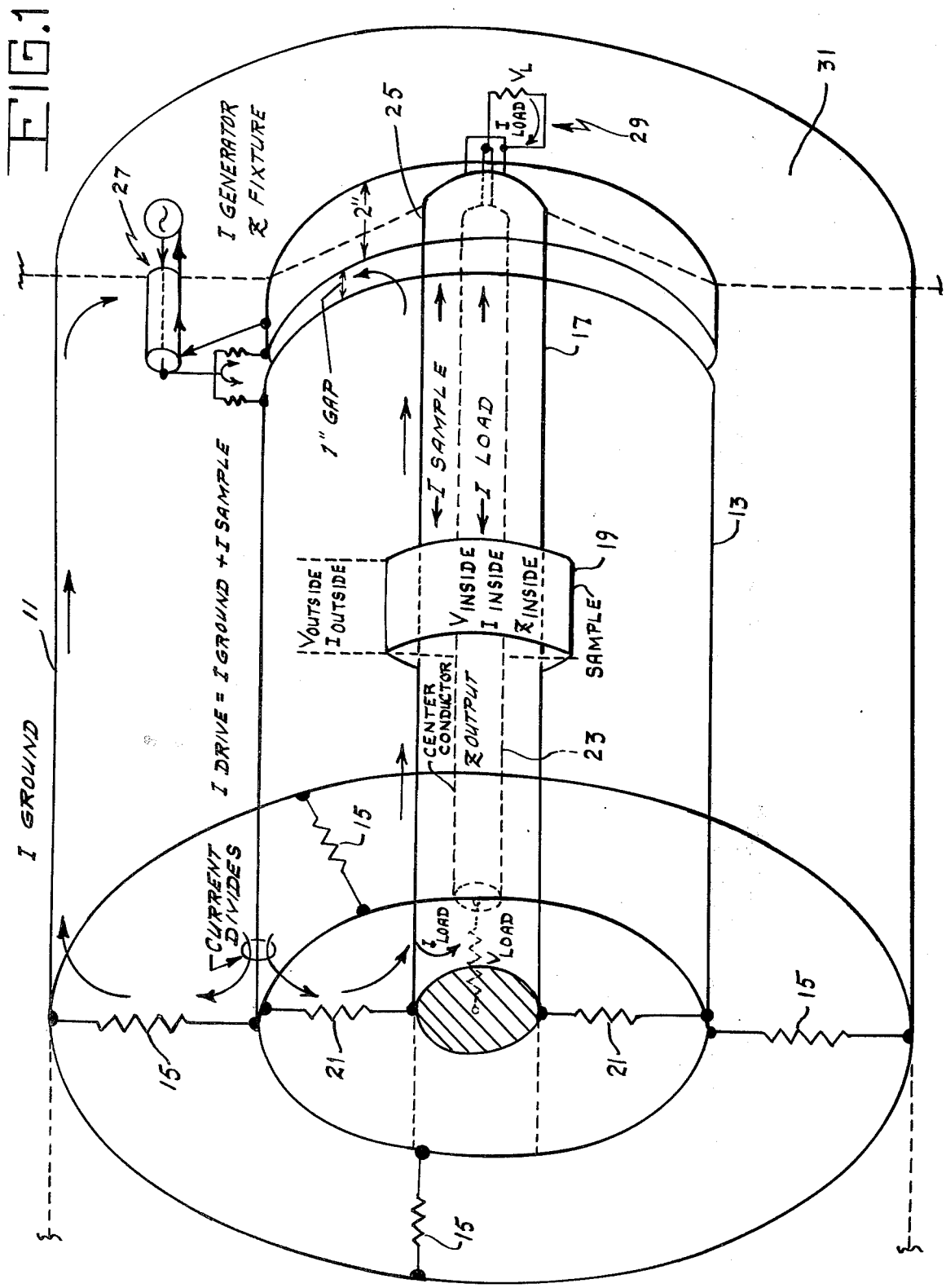
FIG. 1 is a schematic diagram showing an embodiment of the invention.

Referring to FIG. 1, it can be seen that guard cylinder 11 is the outer cylinder of the quadraxial system and provides RF isolation from the external environment. Interior to guard cylinder 11 is driver cylinder 13. These two cylinders are made of wire mesh and are connected to each other through a system of resistors collectively designated as 15. Cylinders 11 and 13 function as an input transmission line. Interior to drive cylinder 13 is sample fixture 17 which provides a returning current path and is modified to contain sample 19 to permit current flow thereto. Sample fixture 17 is connected to drive cylinder 13 through a system of resistors collectively designated as 21. The innermost cylinder 23 conducts sample voltage to a receiver. Cylinder dimensions and resistor loadings are controlled to produce matching transmission lines and eliminate undesirable effects such as resonance and cross talk.

The system can be calibrated in the frequency of interests if certain parameters are controlled, such as $I_s$, the total current on sample 19; $\rho_i$, the input reflection coefficient; $V_i$, the voltage inside the sample; $\rho_o$, the output reflection coefficient; $V_L$, the voltage across the output load; $I_L$, the current in the output load, and SE, the shielding effectiveness.

The total current $I_s$ on sample 19 is measured on the sample fixture with a current probe positioned at 25. This total current will also be on the sample if there are no standing waves (reflections) of significance in the test fixture. Reflections are minimized by terminating each coaxial $Z_o$ with an equal amount of noninductive resistance, R.

Measurements of $\rho_i$ with ratio meter 27 are used to determine the limiting frequency. This is the frequency at which the input impedance of the test fixture (Z fixture) causes a 30 percent reflection coefficient $\rho_i$ which approximates a 9 percent power loss. The grounded shield current ($I_{ground}$), matched resistive loads, and the 45 degree extension of the ground return cylinders assist in maintaining $\rho_i$ less than 30 percent.

The voltage inside the sample $V_i$ drives the output circuit. Each fixtured sample is tested to prove that the $V_i$ is caused by the sample and not by the fixture in order to obtain valid data. $\rho_o$, the output reflection coefficient, is measured with RF meter 29. Reflections in the output circuit must be less than 30 percent. The equipment utilized to measure $V_L$ should be protected from extraneous pickup. Specifically, the $V_L$ signal levels should not be affected by generator leakage through cabline, fixture shields or 60 cycle power lines.

The output voltage ($V_L$) is divided by the output impedance (as an example, 50 ohms) to obtain the current in the output circuit, $I_L$. This current is considered to be flowing in both 50 ohm loads, i.e., one at each end.

The ratio of the sample current $I_s$ to the load current $I_L$ is the conducted current shielding effectiveness, SE. Shielding effectiveness is normally given in decibels by the following formula:

$$SE = 20 \log \frac{I_s}{I_L}.$$

This SE is not a transfer impedance because its level depends on the resistance value of the load. Transfer impedance is $$Z_T = \frac{V_i}{I_s}$$

and is readily obtainable under matched (50 ohm) conditions when $V_i = V_L/2$.

The input signals are applied at one end of the testing device and are measured at the opposite end with the input end sample being in a shielded room. The output end penetrates through wall or partition 31 of the shielded room and is used as a ground plane. Partition 31 separates the output from driver cylinder 13 and forms a shielded room. Between partition 31 and driver cylinder 13 is a short cylinder grounded to partition 31 and gap or discontinuity in driver cylinder 13. In the present example the gap is 1 inch located 2 inches from partition 31.

Figure 2:
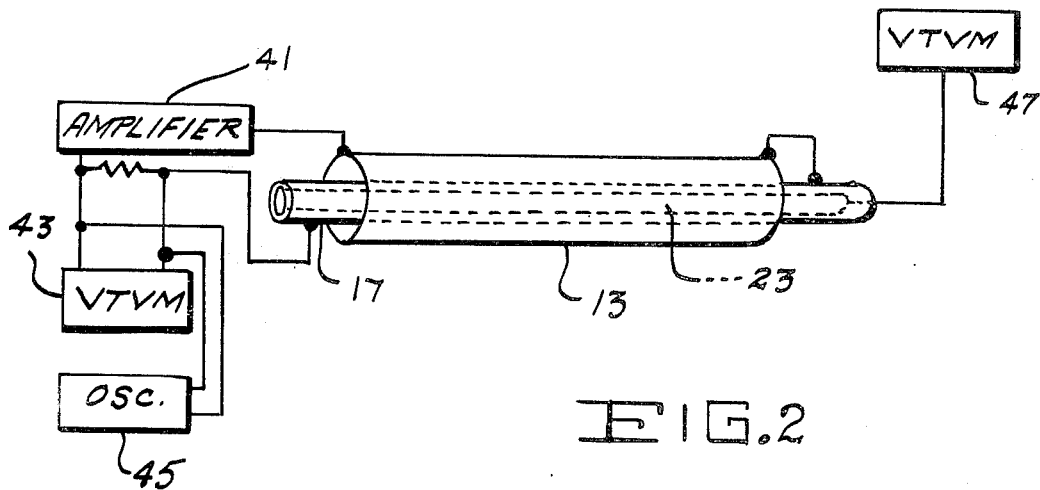
FIG. 2 is a partially block and partially schematic diagram showing the input and output relationships of the invention.

FIG. 2 shows the input and output relationships for the testing device. The input signal is obtained from audio amplifier 41 and the input currents are measured with VTVM 43. Monitoring is performed with oscilloscope 45. The input instruments are connected between driver cylinder 13 and sample fixture 17 and the output is obtained with VTVM 47.

Figure 3:
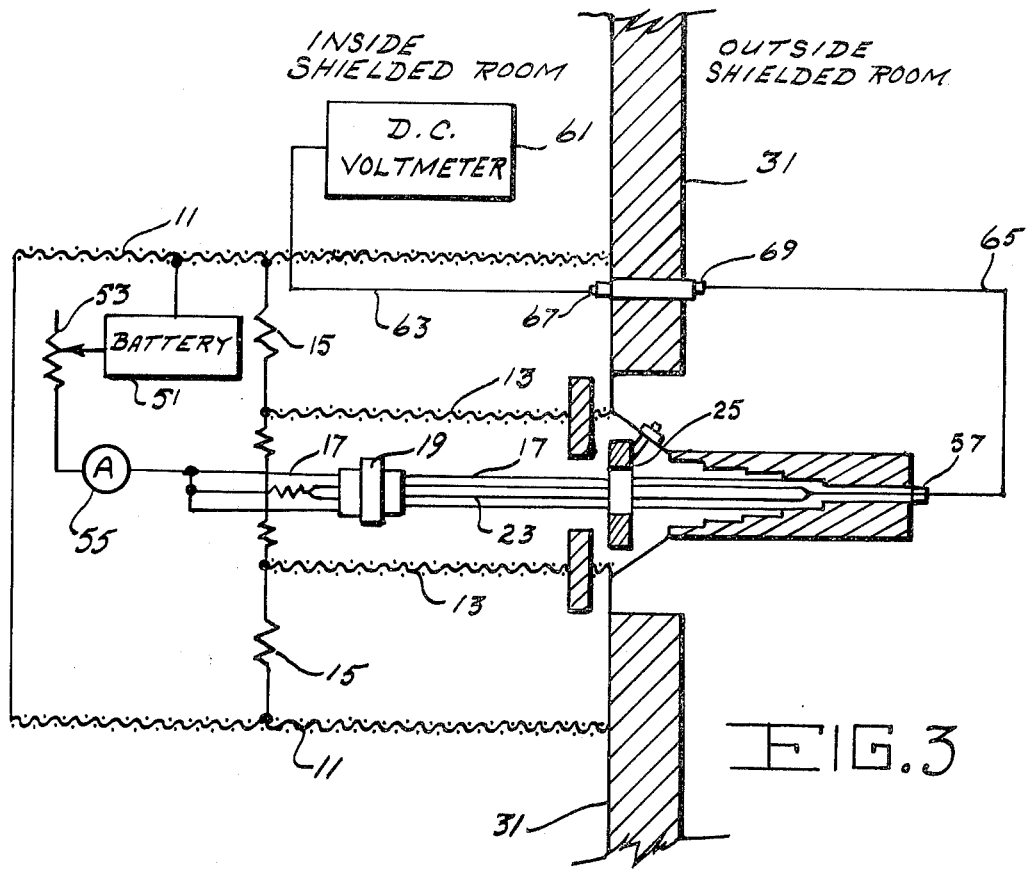
FIG. 3 is a schematic diagram partially in cross section showing the use of the invention when the input signal is a DC voltage.
Figure 4:
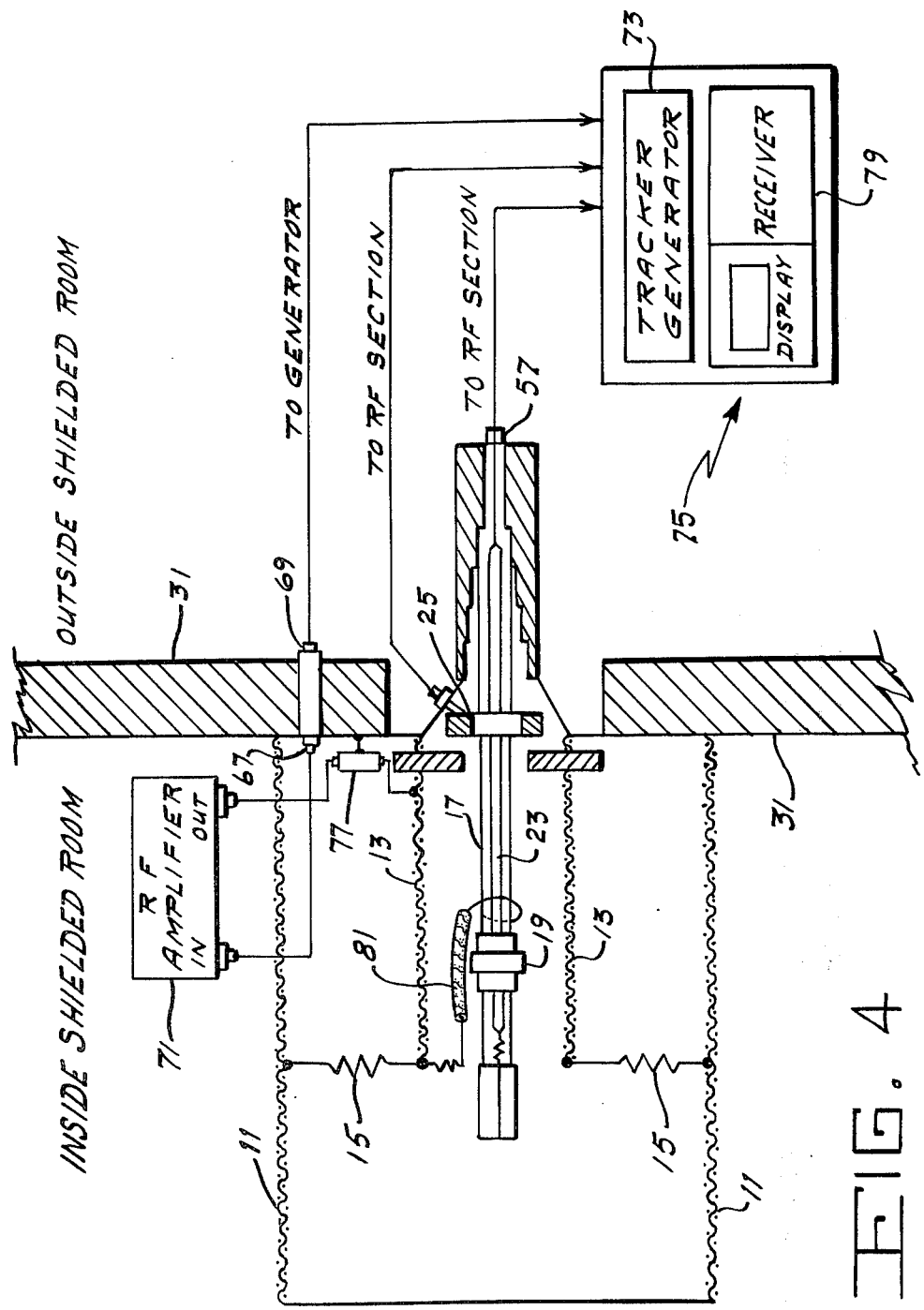
FIG. 4 is a schematic diagram partially in cross section showing the use of the invention when the input signal is an AC voltage.

FIGS. 3 and 4 are referred to for further description of the testing device when used respectively as a DC resistance test and for an AC fixture checkout. In FIG. 3, a DC supply is provided by battery 51 through rheostat 53. Current readings are obtained with ammeter 55. The supply voltage is applied inside a shielded room which is enclosed by partition 31. A DC voltage reading is obtained at point 57 outside the shielded room. DC voltmeter 61 reads the voltage at point 57 and is transferred through partition 31 with shielded cables 63 and 65 and connectors 67 and 69. This permits monitoring of all instruments on one side of the shielded room.

The RF low frequency fixture checkout testing technique shown in FIG. 4 is similar to the DC test of FIG. 3, but RF amplifier 71 provides a signal which is obtained from the tracker generator section 73 of spectrum analyzer system 75. This input to RF amplifier 71 which is inside the shielded room is connected from generator 73 through connectors 67 and 69. The output of amplifier 71 is connected to driver cylinder 13 through input matching pad 77. The RF section of receiver 79 of spectrum analyzer 75 is connected to current probe 25 and also to point 57. Wire loop probe 81 resistively connects sample fixture 17 to drive cylinder 13.

What is claimed is:
1. A system for measuring current shielding effectiveness or transfer impedance comprising:
   a. a guard cylinder;
   b. a driver cylinder having a discontinuity of predetermined dimensions, the driver cylinder being interior to and coaxial with the guard cylinder with a resistive coupling therewith;
   c. means for imparting an electrical signal to the driver cylinder;
   d. a sample interior to and coaxial with the driver cylinder and resistively coupled thereto;
   e. a center conductor interposed and coaxial with the sample cylinder and having a resistive coupling therewith;
   f. receiving means connected to the center conductor; and
   g. a partition surrounding the driver cylinder and shielding the electrical signal imparting means from the receiving means.

2. A system for measuring current shielding effectiveness according to claim 1 wherein the resistive coupling of the guard cylinder to the driver cylinder and the resistive coupling of the sample cylinder to the center conductor have values equal to the respective characteristic impedances.

3. A system for measuring current shielding effectiveness according to claim 2 wherein the guard cylinder and the driver cylinder are of wire mesh.

4. A system for measuring current shielding effectiveness according to claim 3 wherein the electrical signal is a DC voltage.

5. A system for measuring current shielding effectiveness according to claim 3 wherein the electrical signal is an alternating voltage having predetermined frequency limits.

* * * * *